(12) United States Patent
Park et al.

(10) Patent No.: US 11,220,570 B2
(45) Date of Patent: Jan. 11, 2022

(54) POLYMER, HARDMASK COMPOSITION, AND METHOD OF FORMING PATTERNS

(71) Applicant: SAMSUNG SDI CO., LTD., Yongin-si (KR)

(72) Inventors: Soyeon Park, Yongin-si (KR); Youngmin Kim, Yongin-si (KR); Yongsik Yoo, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 80 days.

(21) Appl. No.: 16/724,777

(22) Filed: Dec. 23, 2019

(65) Prior Publication Data

US 2020/0207902 A1 Jul. 2, 2020

(30) Foreign Application Priority Data

Dec. 26, 2018 (KR) .................. 10-2018-0169596

(51) Int. Cl.
| | | |
|---|---|---|
| *C08G 12/26* | (2006.01) | |
| *C09D 161/26* | (2006.01) | |
| *G03F 7/11* | (2006.01) | |
| *G03F 7/30* | (2006.01) | |
| *G03F 7/16* | (2006.01) | |
| *G03F 7/20* | (2006.01) | |

(52) U.S. Cl.
CPC ........... *C08G 12/26* (2013.01); *C09D 161/26* (2013.01); *G03F 7/11* (2013.01); *G03F 7/16* (2013.01); *G03F 7/20* (2013.01); *G03F 7/30* (2013.01)

(58) Field of Classification Search
CPC .......................... C09D 161/26; H01L 21/0271
See application file for complete search history.

(56) References Cited

U.S. PATENT DOCUMENTS

| | | | |
|---|---|---|---|
| 2015/0044876 A1 | 2/2015 | Nishimaki et al. | |
| 2015/0248057 A1 | 9/2015 | Ohnishi et al. | |
| 2016/0090449 A1* | 3/2016 | Nam ................... G03F 7/094 | 438/703 |
| 2016/0237195 A1* | 8/2016 | Namgung ............. G03F 7/094 | |
| 2017/0008843 A1* | 1/2017 | Kwon .................. C09D 179/04 | |
| 2017/0227850 A1* | 8/2017 | Nishimaki .......... H01L 21/3086 | |
| 2019/0233576 A1* | 8/2019 | Jung ...................... C08G 14/06 | |
| 2020/0207902 A1* | 7/2020 | Park ..................... C09D 161/26 | |

FOREIGN PATENT DOCUMENTS

| | | | | |
|---|---|---|---|---|
| JP | 2016-151024 | A | 8/2016 | |
| JP | 6094767 | B2 | 2/2017 | |
| JP | 2020-503395 | A | 1/2020 | |
| KR | 10-2014-0144207 | A | 12/2014 | |
| KR | 10-2015-0002929 | | 1/2015 | |
| KR | 10-2015-0052861 | A | 5/2015 | |
| KR | 10-2015-0117174 | A | 10/2015 | |
| KR | 10-2016-0061772 | | 6/2016 | |
| KR | 10-2016-0101583 | A | 8/2016 | |
| KR | 10-2016-0140596 | | 12/2016 | |
| KR | 10-2017-0005636 | | 1/2017 | |
| KR | 10-2017-0042500 | | 4/2017 | |
| KR | 10-2018-0046236 | | 5/2018 | |
| KR | 10-2018-0047283 | A | 5/2018 | |
| KR | 10-2018-0048799 | | 5/2018 | |
| KR | 10-2018-0052505 | A | 5/2018 | |
| TW | 201620981 | A | 6/2016 | |
| TW | 201702222 | A | 1/2017 | |
| TW | 201723664 | A | 7/2017 | |
| WO | WO-2018088673 | A1 * | 5/2018 | ............... G03F 7/09 |
| WO | WO 2018/131562 | A1 | 7/2018 | |

OTHER PUBLICATIONS

Office Action dated Oct. 27, 2020 of the corresponding Japanese Patent Application No. 2019-235032.

\* cited by examiner

*Primary Examiner* — Christopher M Rodd
(74) *Attorney, Agent, or Firm* — Lee IP Law, P.C.

(57) ABSTRACT

A polymer, a hardmask composition, and a method of forming patterns, the polymer including structural units obtained by a reaction of a reaction mixture that includes a substituted or unsubstituted indole compound, a first aromatic aldehyde compound including a substituted or unsubstituted C3 to C20 branched alkyl group thereon, and a second aromatic aldehyde compound that is different from the first aromatic aldehyde compound.

12 Claims, No Drawings

POLYMER, HARDMASK COMPOSITION, AND METHOD OF FORMING PATTERNS

CROSS-REFERENCE TO RELATED APPLICATION

Korean Patent Application No. 10-2018-0169596, filed on Dec. 26, 2018, in the Korean Intellectual Property Office, and entitled: "Polymer and Hardmask Composition and Method of Forming Patterns," is incorporated by reference herein in its entirety.

BACKGROUND

1. Field

A polymer, a hardmask composition including the polymer, and a method of forming patterns using the hardmask composition are disclosed.

2. Description of the Related Art

The semiconductor industry has developed to include an ultra-fine technique having a pattern of several to several tens of nanometer size. Such ultrafine technique utilizes effective lithographic techniques.

Some lithographic techniques include providing a material layer on a semiconductor substrate; coating a photoresist layer thereon; exposing and developing the same to provide a photoresist pattern; and etching a material layer using the photoresist pattern as a mask.

SUMMARY

The embodiments may be realized by providing a polymer including structural units obtained by a reaction of a reaction mixture that includes a substituted or unsubstituted indole compound, a first aromatic aldehyde compound including a substituted or unsubstituted C3 to C20 branched alkyl group thereon, and a second aromatic aldehyde compound that is different from the first aromatic aldehyde compound.

The indole compound may be represented by Chemical Formula 1:

[Chemical Formula 1]

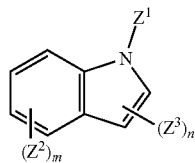

wherein, in Chemical Formula 1, $Z^1$ may be hydrogen, a hydroxy group, a halogen atom, a substituted or unsubstituted C1 to C30 alkoxy group, a substituted or unsubstituted C1 to C30 alkyl group, a substituted or unsubstituted C1 to C30 cycloalkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heterocyclic group, or a combination thereof, $Z^2$ and $Z^3$ may be independently a hydroxy group, a halogen atom, a substituted or unsubstituted C1 to C30 alkoxy group, a substituted or unsubstituted C1 to C30 alkyl group, a substituted or unsubstituted C1 to C30 cycloalkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heterocyclic group, or a combination thereof, m may be an integer of 0 to 4, and n may be an integer of 0 to 2.

The substituted or unsubstituted C3 to C20 branched alkyl group may be a substituted or unsubstituted tert-butyl group.

The first aromatic aldehyde compound may include a substituted or unsubstituted aromatic ring moiety of Group 1:

[Group 1]

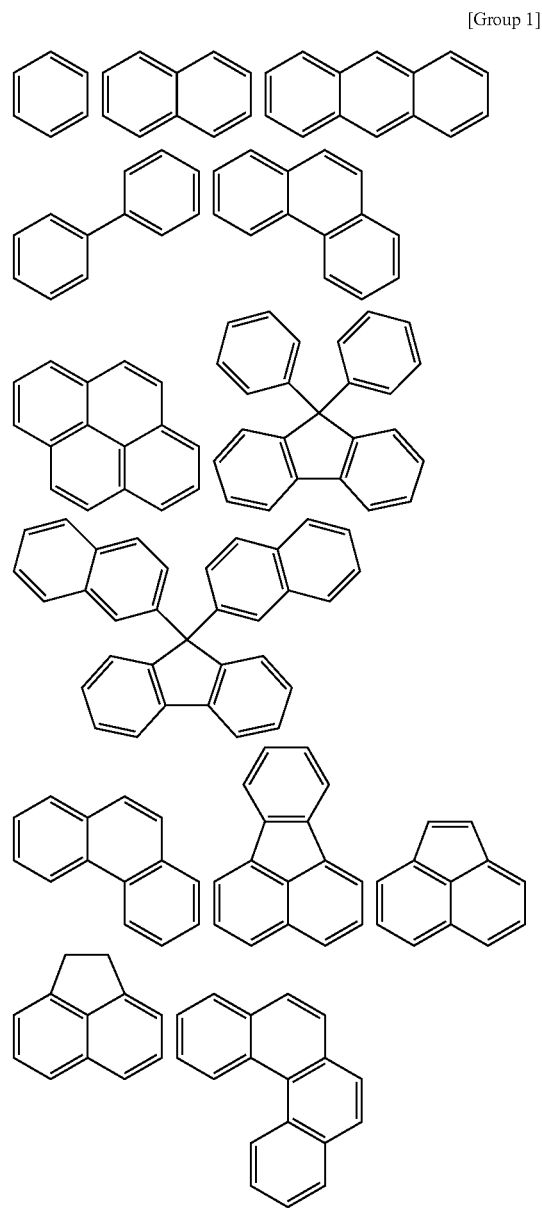

-continued

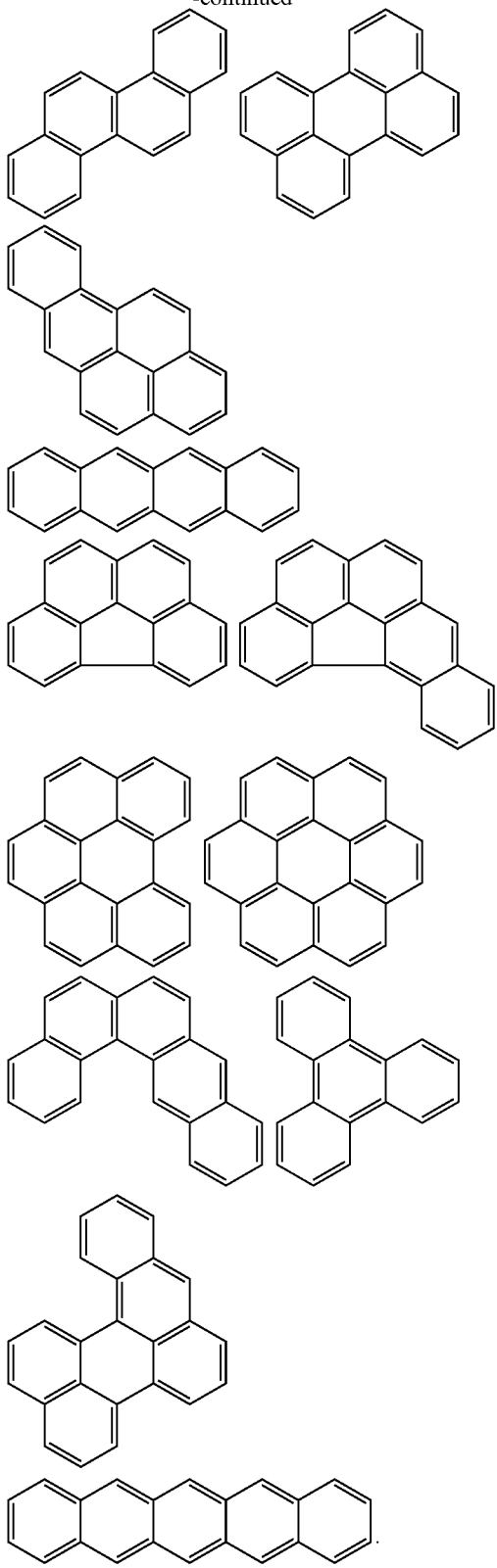

The first aromatic aldehyde compound may be a benzaldehyde substituted with a C3 to C20 branched alkyl group, a naphthaldehyde substituted with a C3 to C20 branched alkyl group, an anthracenecarboxaldehyde substituted with a C3 to C20 branched alkyl group, or a pyrenecarboxaldehyde substituted with a C3 to C20 branched alkyl group.

The second aromatic aldehyde compound may include a substituted or unsubstituted aromatic ring moiety of Group 2:

[Group 2]

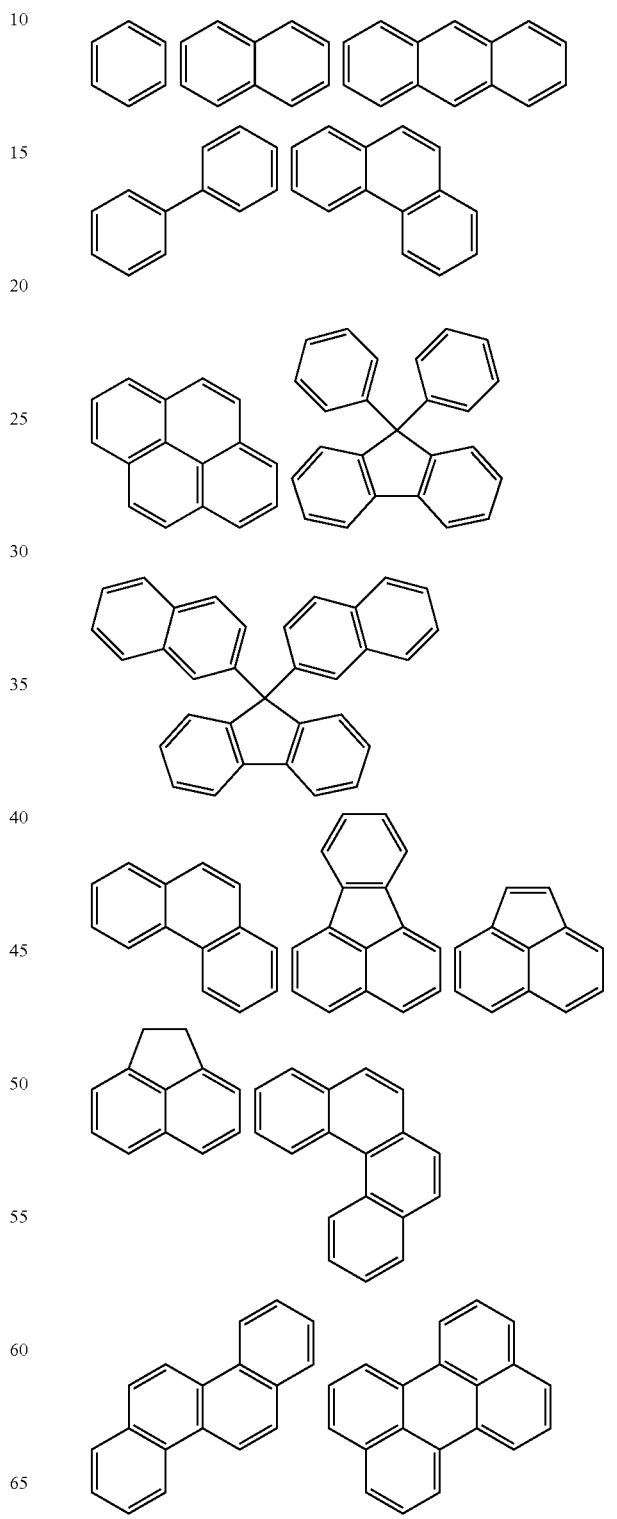

-continued

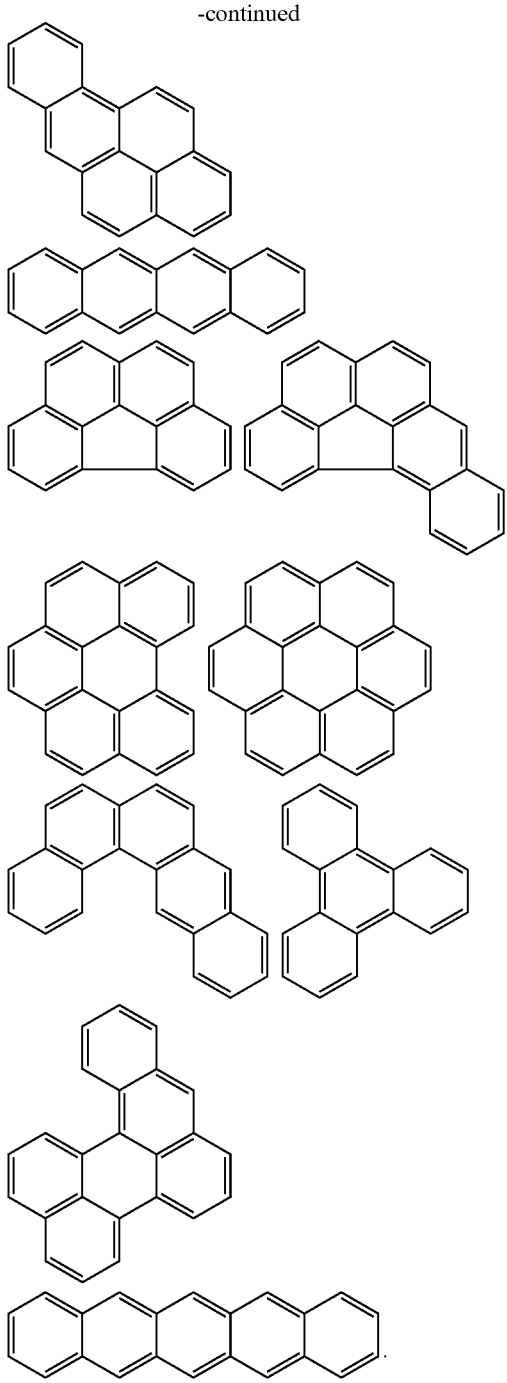

The second aromatic aldehyde compound may include a C6 to C30 aromatic ring substituted at least one hydroxy group.

At least one of the first aromatic aldehyde compound and the second aromatic aldehyde compound may include a condensed ring.

The first aromatic aldehyde compound may be a benzaldehyde substituted with a C3 to C20 branched alkyl group, a naphthaldehyde substituted with a C3 to C20 branched alkyl group, an anthracenecarboxaldehyde substituted with a C3 to C20 branched alkyl group, or a pyrenecarboxaldehyde substituted with a C3 to C20 branched alkyl group, and the second aromatic aldehyde compound may be a substituted or unsubstituted pyrenecarboxaldehyde.

The indole compound may be included in the reaction mixture in an amount of about 1 mol % to about 50 mol %, the first aromatic aldehyde compound may be included in the reaction mixture in an amount of about 1 mol % to about 80 mol %, and the second aromatic aldehyde compound may be included in the reaction mixture in an amount of about 1 mol % to about 80 mol %, all mol % being based on a total number of moles of the indole compound, the first aromatic aldehyde compound, and the second aromatic aldehyde compound in the reaction mixture.

The embodiments may be realized by providing a hardmask composition including the polymer according to an embodiment, and a solvent.

The embodiments may be realized by providing a method of forming patterns, the method including applying the hardmask composition according to an embodiment on a material layer and heat-treating the same to form a hardmask layer, forming a photoresist layer on the hardmask layer, exposing and developing the photoresist layer to form a photoresist pattern, selectively removing the hardmask layer using the photoresist pattern to expose a portion of the material layer, and etching the exposed portion of the material layer.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

As used herein, when a definition is not otherwise provided, "substituted" refers to replacement of a hydrogen atom of a compound by a substituent selected from deuterium, a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heterocyclic group, and a combination thereof.

In addition, two adjacent substituents of the substituted halogen atom (F, Br, Cl, or I), hydroxy group, nitro group, cyano group, amino group, azido group, amidino group, hydrazino group, hydrazono group, carbonyl group, carbamyl group, thiol group, ester group, carboxyl group or salt thereof, sulfonic acid group or salt thereof, phosphoric acid group or salt thereof, C1 to C30 alkyl group, C2 to C30 alkenyl group, C2 to C30 alkynyl group, C6 to C30 aryl group, C7 to C30 arylalkyl group, C1 to C30 alkoxy group, C1 to C20 heteroalkyl group, C3 to C20 heteroarylalkyl group, C3 to C30 cycloalkyl group, C3 to C15 cycloalkenyl group, C6 to C15 cycloalkynyl group, and C2 to C30 heterocyclic group may be fused to form a ring. For example, the substituted C6 to C30 aryl group may be fused with another adjacent substituted C6 to C30 aryl group to form a substituted or unsubstituted fluorene ring.

As used herein, when a definition is not otherwise provided, "hetero" refers to one including 1 to 3 heteroatoms selected from N, O, S, Se, and P.

As used herein, "aryl group" refers to a group including at least one hydrocarbon aromatic moiety, and includes hydrocarbon aromatic moieties linked by a single bond and hydrocarbon aromatic moieties fused directly or indirectly to provide a non-aromatic fused ring. The aryl group may include a monocyclic, polycyclic, or fused polycyclic (i.e., rings sharing adjacent pairs of carbon atoms) functional group.

As used herein, "heterocyclic group" is a concept including a heteroaryl group, and may include at least one hetero atom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

More specifically, the substituted or unsubstituted aryl group and/or the substituted or unsubstituted heterocyclic group may be a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenyl group, a substituted or unsubstituted terphenyl group, a substituted or unsubstituted quaterphenyl group, a substituted or unsubstituted chrysenyl group, a substituted or unsubstituted triphenylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridinyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted fluorenyl group, a substituted or unsubstituted dibenzofuranyl group, a substituted or unsubstituted dibenzothiophenyl group, a substituted or unsubstituted carbazolyl group, a substituted or unsubstituted pyridoindolyl group, a substituted or unsubstituted benzopyridooxazinyl group, a substituted or unsubstituted benzopyridothiazinyl group, a substituted or unsubstituted 9,9-dimethyl 9,10 dihydroacridinyl group, a combination thereof, or a combined fused ring of the foregoing groups. In one example, the heterocyclic group or the heteroaryl group may be a pyridyl group, an indolyl group, a carbazolyl group, or a pyridoindolyl group.

As used herein, when specific definition is not otherwise provided, "combination" refers to mixing, bonding, or copolymerization.

As used herein, the polymer is meant to include an oligomer and a polymer.

Hereinafter, a polymer according to an embodiment is described.

The polymer according to an embodiment may include, e.g., a structural unit obtained by a reaction of a reaction mixture including a heterocyclic compound and an aromatic aldehyde compound.

The heterocyclic compound may include, e.g., a nitrogen-containing ring. In an implementation, the heterocyclic compound may be, e.g., a nitrogen-containing polycyclic compound. In an implementation, the heterocyclic compound may be, e.g., an indole or a derivative thereof (hereinafter, referred to as "an indole compound").

The aromatic aldehyde compound may include a first aromatic aldehyde compound (having a bulky substituent thereon, e.g., at a terminal end thereof), and may further include a second aromatic aldehyde compound that is different from the first aromatic aldehyde compound. The bulky substituent may include, e.g., a substituted or unsubstituted C3 to C20 branched alkyl group.

The structural unit may include a main chain including a heterocyclic moiety of or derived from the heterocyclic compound and a side chain bonded to the main chain and being a moiety of or derived from the aromatic aldehyde compound. Aromatic rings may be bonded to the main chain as a tertiary carbon. For example, the polymer may include a tertiary carbon, which may not only help increase solubility in a solvent, but may also help increase a carbon content, forming a rigid polymer layer that imparts high etch resistance.

For example, the polymer may include a structural unit obtained by a reaction of a reaction mixture including a substituted or unsubstituted indole compound, the first aromatic aldehyde compound having a substituted or unsubstituted C3 to C20 branched alkyl group thereon, and the second aromatic aldehyde compound that is different from the first aromatic aldehyde compound.

The polymer may not only exhibit increased solubility in a solvent but may also form a rigid polymer layer due to an indole moiety derived from the indole compound, thereby providing high heat resistance and high etch resistance. For example, the polymer may be prepared as a solution, and may be effectively formed into the polymer layer by a solution process such as spin-on coating. The formed polymer layer may help reduce or prevent heat damage in subsequent high temperature processes, and may help reduce or prevent damage caused by etching gas exposed in subsequent etching processes due to high heat resistance and etch resistance.

In an implementation, the indole compound may be, e.g., represented by Chemical Formula 1.

[Chemical Formula 1]

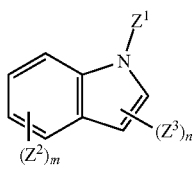

In Chemical Formula 1, $Z^1$ may be or may include, e.g., hydrogen, a hydroxy group, a halogen atom, a substituted or unsubstituted C1 to C30 alkoxy group, a substituted or unsubstituted C1 to C30 alkyl group, a substituted or unsubstituted C1 to C30 cycloalkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heterocyclic group, or a combination thereof, $Z^2$ and $Z^3$ may each independently be or include, e.g., a hydroxy group, a halogen atom, a substituted or unsubstituted C1 to C30 alkoxy group, a substituted or unsubstituted C1 to C30 alkyl group, a substituted or unsubstituted C1 to C30 cycloalkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heterocyclic group, or a combination thereof, m may be, e.g., an integer of 0 to 4, and n may be, e.g., an integer of 0 to 2.

In an implementation, $Z^1$ may be hydrogen.

In an implementation, $Z^1$ to $Z^3$ may be the same or different.

In an implementation, $Z^2$ and $Z^3$ may be the same or different.

In an implementation, at least one of $Z^2$ and $Z^3$ may be a hydroxy group.

In an implementation, m may be an integer of 0 to 3, n may be 0 or 1. In an implementation, m and n may each independently be 0 or 1. In an implementation, m and n may both be 0.

The indole compound may form the structural unit of the polymer by reaction of a reaction mixture including the first aromatic aldehyde compound having the bulky substituent thereon and the second aromatic aldehyde compound as described above. The structural unit may have a structure in which an indole moiety derived from the indole compound is combined with an aromatic side chain derived from the first and second aromatic aldehyde compounds. The aromatic side chain may include at least two aromatic rings by including an aromatic ring derived from the first aromatic aldehyde compound and an aromatic ring derived from the second aromatic aldehyde compound, thereby forming a more rigid polymer layer and thus further improving heat resistance and etch resistance. In an implementation, the bulky substituent, e.g., a substituted or unsubstituted C3 to C20 branched alkyl group of the first aromatic aldehyde compound, may be positioned at the terminal ends of the aromatic side chain, which further enhances solubility of the polymer in organic solvents and the polymer layer may be more effectively formed by using a solution process such as spin-on coating.

In an implementation, the substituted or unsubstituted C3 to C20 branched alkyl group may be or may include, e.g., a substituted or unsubstituted C3 to C20 iso-alkyl group, a substituted or unsubstituted C3 to C20 sec-alkyl group, a substituted or unsubstituted C4 to C20 tert-alkyl group, or a substituted or unsubstituted C5 to C20 neo-alkyl group. In an implementation, the substituted or unsubstituted C3 to C20 branched alkyl group may be or may include, e.g., a substituted or unsubstituted C4 to C20 tert-alkyl group.

In an implementation, the substituted or unsubstituted C3 to C20 branched alkyl group may be or may include, e.g., a substituted or unsubstituted iso-propyl group, a substituted or unsubstituted iso-butyl group, a substituted or unsubstituted sec-butyl group, a substituted or unsubstituted tert-butyl group, a substituted or unsubstituted iso-pentyl group, a substituted or unsubstituted sec-pentyl group, a substituted or unsubstituted tert-pentyl group, or a substituted or unsubstituted neo-pentyl group. In an implementation, the substituted or unsubstituted C3 to C20 branched alkyl group may be or may include, e.g., a substituted or unsubstituted tert-butyl group.

In an implementation, the first aromatic aldehyde compound may include the aromatic ring substituted with the substituted or unsubstituted C3 to C20 branched alkyl group.

In an implementation, the aromatic ring substituted with the substituted or unsubstituted C3 to C20 branched alkyl group may be a condensed ring or a non-condensed ring.

The first aromatic aldehyde compound may include the aromatic ring, and a carbon content of the polymer may be further increased to form a rigid polymer layer, thereby providing high etch resistance.

In an implementation, the first aromatic aldehyde compound may include, e.g., a substituted or unsubstituted aromatic ring moiety of Group 1. For example, in the first aromatic aldehyde compound, the aromatic ring moiety of Group 1 may be further substituted with a suitable substituent.

[Group 1]

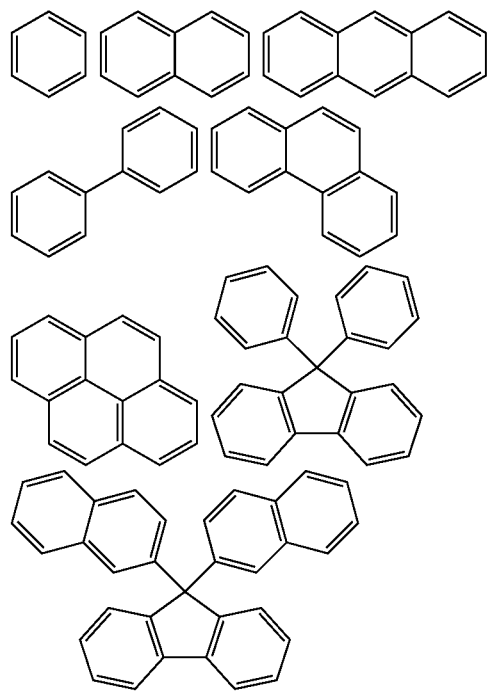

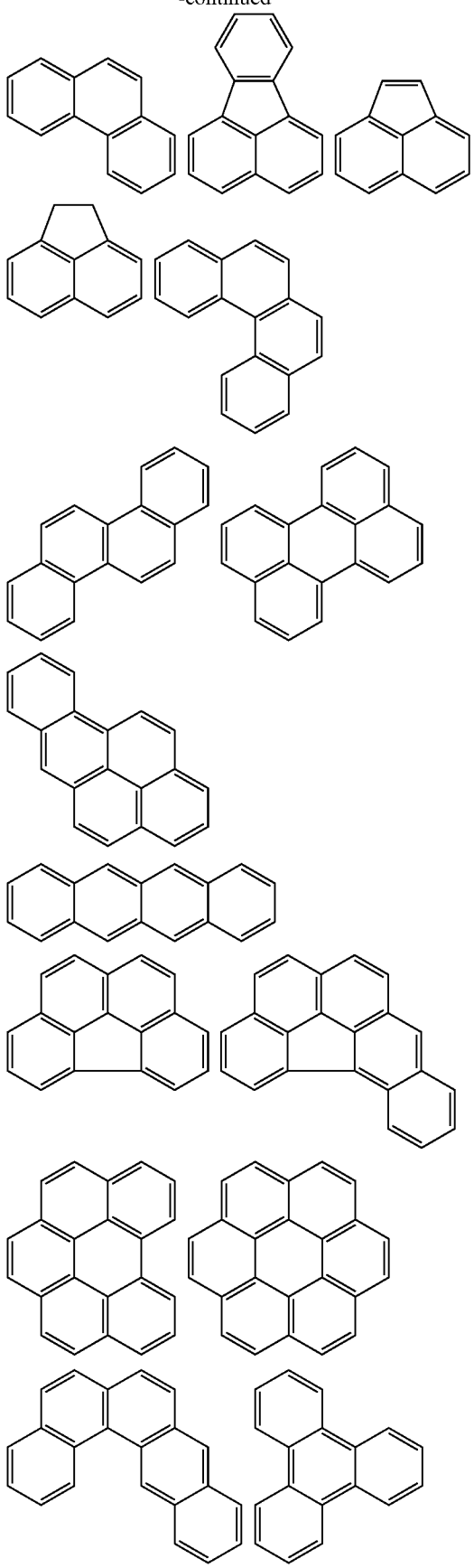
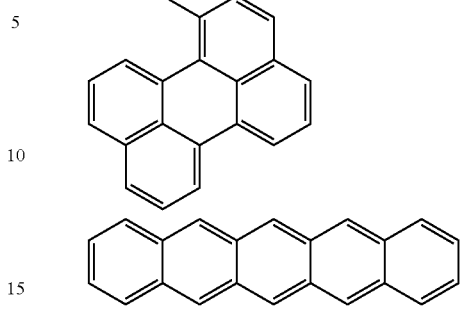

In an implementation, the first aromatic aldehyde compound may include, e.g., a phenyl group substituted with a C3 to C20 branched alkyl group, a naphthyl group substituted with a C3 to C20 branched alkyl group, a biphenyl group substituted with a C3 to C20 branched alkyl group, a fluorenyl group substituted with a C3 to C20 branched alkyl group, an anthracenyl group substituted with a C3 to C20 branched alkyl group, a fluoranthenyl group substituted with a C3 to C20 branched alkyl group, an acenaphthylenyl group substituted with a C3 to C20 branched alkyl group, an acenaphthenyl group substituted with a C3 to C20 branched alkyl group, a phenanthrenyl group substituted with a C3 to C20 branched alkyl group, a benzophenanthrenyl group substituted with a C3 to C20 branched alkyl group, a pyrenyl group substituted with a C3 to C20 branched alkyl group, a triperylenyl group substituted with a C3 to C20 branched alkyl group, a chrysenyl group substituted with a C3 to C20 branched alkyl group, a tetracenyl group substituted with a C3 to C20 branched alkyl group, a benzofluoranthenyl group substituted with a C3 to C20 branched alkyl group, a perylenyl group substituted with a C3 to C20 branched alkyl group, a benzopyrenyl group substituted with a C3 to C20 branched alkyl group, a naphthoanthracenyl group substituted with a C3 to C20 branched alkyl group, a pentacenyl group substituted with a C3 to C20 branched alkyl group, a benzoperylenyl group substituted with a C3 to C20 branched alkyl group, a dibenzopyrenyl group substituted with a C3 to C20 branched alkyl group, a coronenyl group substituted with a C3 to C20 branched alkyl group, or a combination thereof.

In an implementation, the first aromatic aldehyde compound may include, e.g., a phenyl group substituted with a tert-butyl group, a naphthyl group substituted with a tert-butyl group, a biphenyl group substituted with a tert-butyl group, a fluorenyl group substituted with a tert-butyl group, an anthracenyl group substituted with a tert-butyl group, a fluoranthenyl group substituted with a tert-butyl group, an acenaphthylenyl group substituted with a tert-butyl group, an acenaphthenyl group substituted with a tert-butyl group, a phenanthrenyl group substituted with a tert-butyl group, a benzophenanthrenyl group substituted with a tert-butyl group, a pyrenyl group substituted with a tert-butyl group, a triperylenyl group substituted with a tert-butyl group, a chrysenyl group substituted with a tert-butyl group, a tetracenyl group substituted with a tert-butyl group, a benzofluoranthenyl group substituted with a tert-butyl group, a perylenyl group substituted with a tert-butyl group, a benzopyrenyl group substituted with a tert-butyl group, a naphthoanthracenyl group substituted with a tert-butyl group, a pentacenyl group substituted with a tert-butyl group, a benzoperylenyl group substituted with a tert-butyl group, a dibenzopyrenyl group substituted with a tert-butyl group, a coronenyl group substituted with a tert-butyl group, or a combination thereof.

In an implementation, the first aromatic aldehyde compound may be, e.g., represented by Chemical Formula 2.

[Chemical Formula 2]

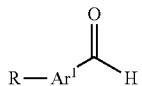

In Chemical Formula 2, $Ar^1$ may be, e.g., a C6 to C30 aromatic ring (e.g., substituted with R), and R may be, e.g., a substituted or unsubstituted C3 to C20 branched alkyl group.

In an implementation, R may be, e.g., a substituted or unsubstituted C3 to C20 iso-alkyl group, a substituted or unsubstituted C3 to C20 sec-alkyl group, a substituted or unsubstituted C4 to C20 tert-alkyl group, or a substituted or unsubstituted C5 to C20 neo-alkyl group. In an implementation, R may be, e.g., a substituted or unsubstituted C4 to C20 tert-alkyl group.

In an implementation, R may be, e.g., a substituted or unsubstituted iso-propyl group, a substituted or unsubstituted iso-butyl group, a substituted or unsubstituted sec-butyl group, a substituted or unsubstituted tert-butyl group, a substituted or unsubstituted iso-pentyl group, a substituted or unsubstituted sec-pentyl group, a substituted or unsubstituted tert-pentyl group, or a substituted or unsubstituted neo-pentyl group. In an implementation, R may be, e.g., a substituted or unsubstituted tert-butyl group.

The polymer may include, e.g., an aromatic ring moiety derived from the first aromatic aldehyde compound (substituted with a substituted or unsubstituted tert-butyl group), solubility of the polymer in an organic solvent may be increased, and the polymer may provide a polymer layer having high etch resistance against $CF_x$ etching gas compared with a polymer including an aromatic ring moiety derived from an aldehyde compound substituted with a hydroxy group.

For example, $Ar^1$ may be a C6 to C30 non-condensed aromatic ring substituted with R and/or a C6 to C30 condensation aromatic ring substituted with R.

In an implementation, $Ar^1$ may be, e.g., substituted or unsubstituted ring moiety of Group 1.

[Group 1]

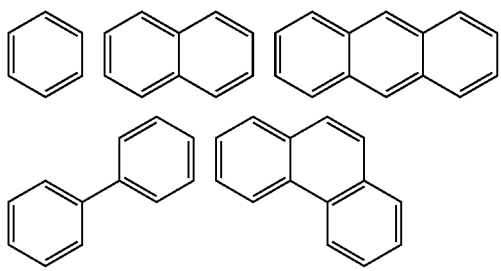

-continued

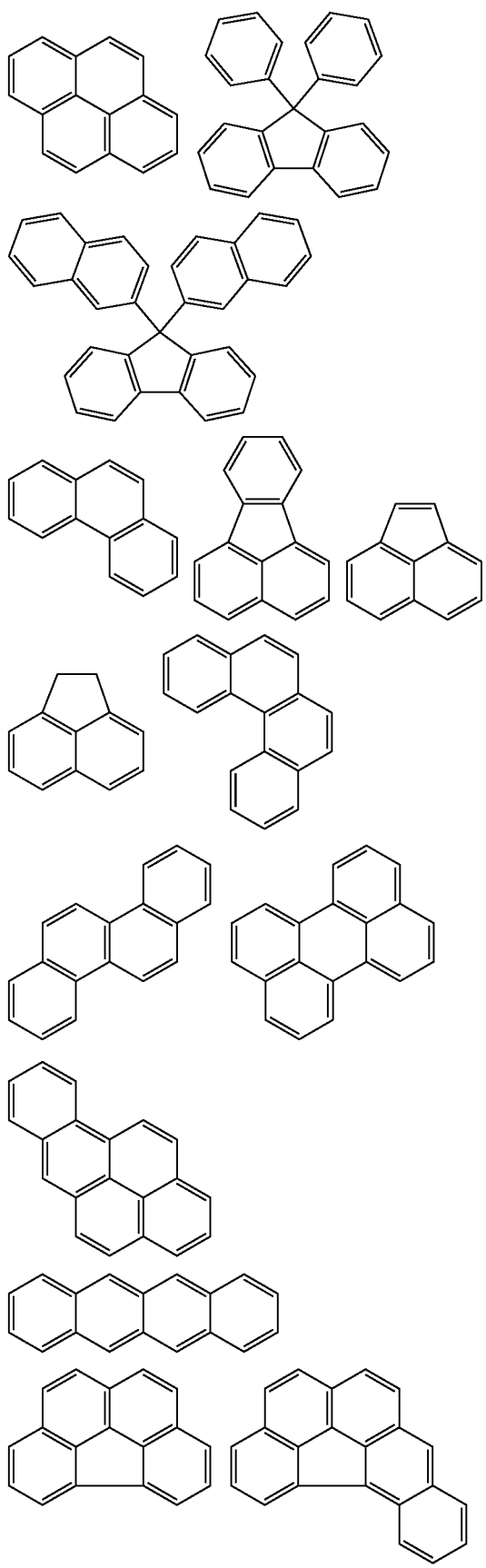

-continued

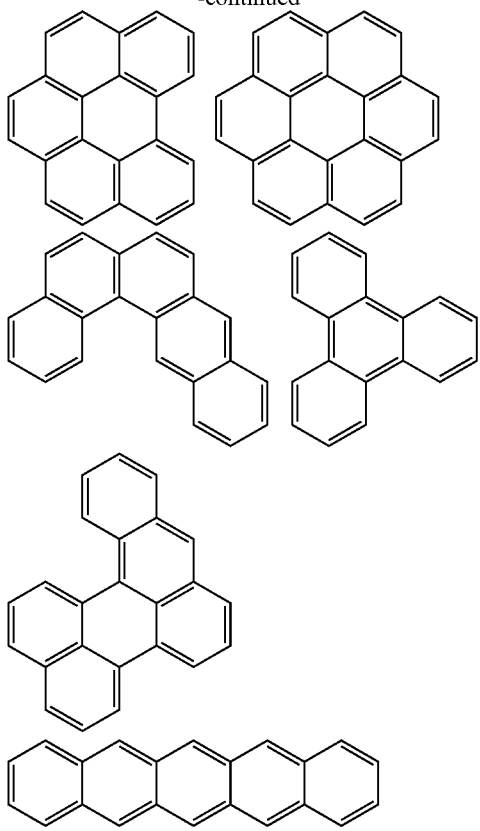

In an implementation, $Ar^1$ may have a substituent other than R. In an implementation, $Ar^1$ may not have another substituent, e.g., $Ar^1$ may not have a hydroxy group as a substituent.

In an implementation, the first aromatic aldehyde compound may be, e.g., benzaldehyde substituted with a C3 to C20 branched alkyl group, naphthaldehyde substituted with a C3 to C20 branched alkyl group, anthracenecarboxaldehyde substituted with a C3 to C20 branched alkyl group, or pyrenecarboxaldehyde substituted with a C3 to C20 branched alkyl group.

In an implementation, the first aromatic aldehyde compound may be, e.g., tert-butyl benzaldehyde, tert-butyl naphthaldehyde, tert-butyl anthracenecarboxaldehyde, or tert-butyl pyrenecarboxaldehyde.

In an implementation, the first aromatic aldehyde compound may be, e.g., ortho-tert-butyl benzaldehyde, meta-tert-butyl benzaldehyde, para-tert-butyl benzaldehye, 6-(tert-butyl)-2-naphthaldehyde, 10-tert-butyl-9-anthracenecarboxaldehyde, or 7-(tert-butyl)-1-pyrenecarboxaldehyde.

As described above, the polymer may provide a more rigid polymer layer by further including an aromatic ring derived from the second aromatic aldehyde compound, and may help improve heat resistance and etch resistance.

In an implementation, the second aromatic aldehyde compound may include a substituted or unsubstituted C6 to C30 aromatic ring.

In an implementation, the substituted or unsubstituted C6 to C30 aromatic ring may be, e.g., a condensed ring or a non-condensed ring. In an implementation, the substituted or unsubstituted C6 to C30 aromatic ring may be, e.g., a condensed ring.

For example, when the second aromatic aldehyde compound includes the condensed ring, the polymer may form a rigid polymer layer, thereby providing a higher etch resistance.

By controlling the aromaticity and the number of rings of the substituted or unsubstituted aromatic ring of the second aromatic aldehyde compound, etch resistance of a polymer layer formed of the polymer may be controlled.

In an implementation, the second aromatic aldehyde compound may include a substituted or unsubstituted aromatic ring moiety of Group 2. For example, in the second aromatic aldehyde compound, the aromatic ring moiety of Group 2 may be further substituted with a suitable substituent.

[Group 2]

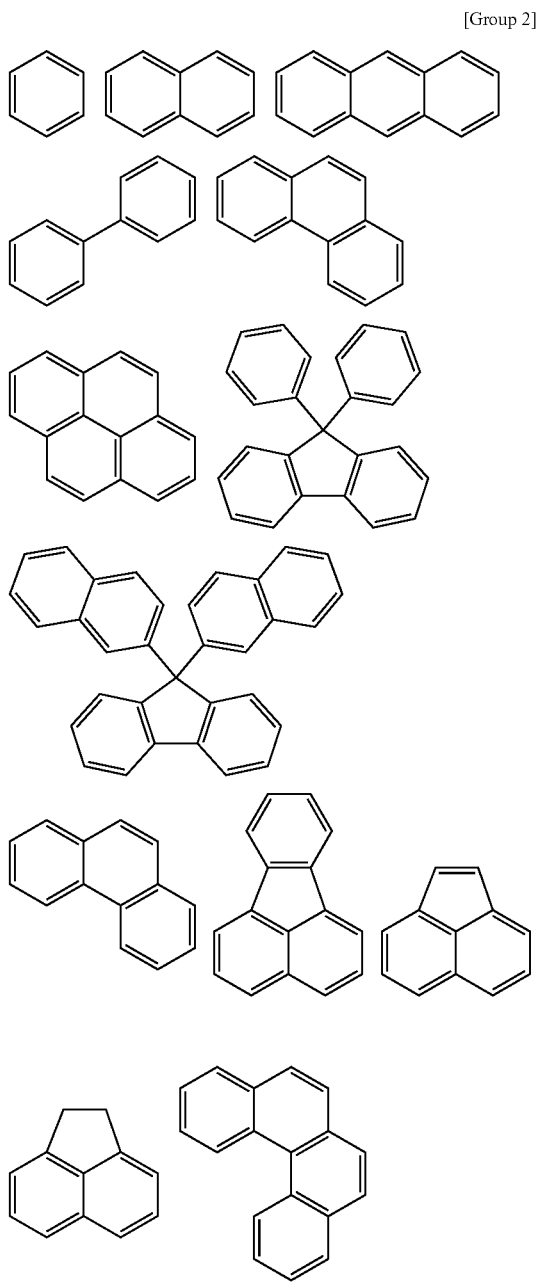

-continued

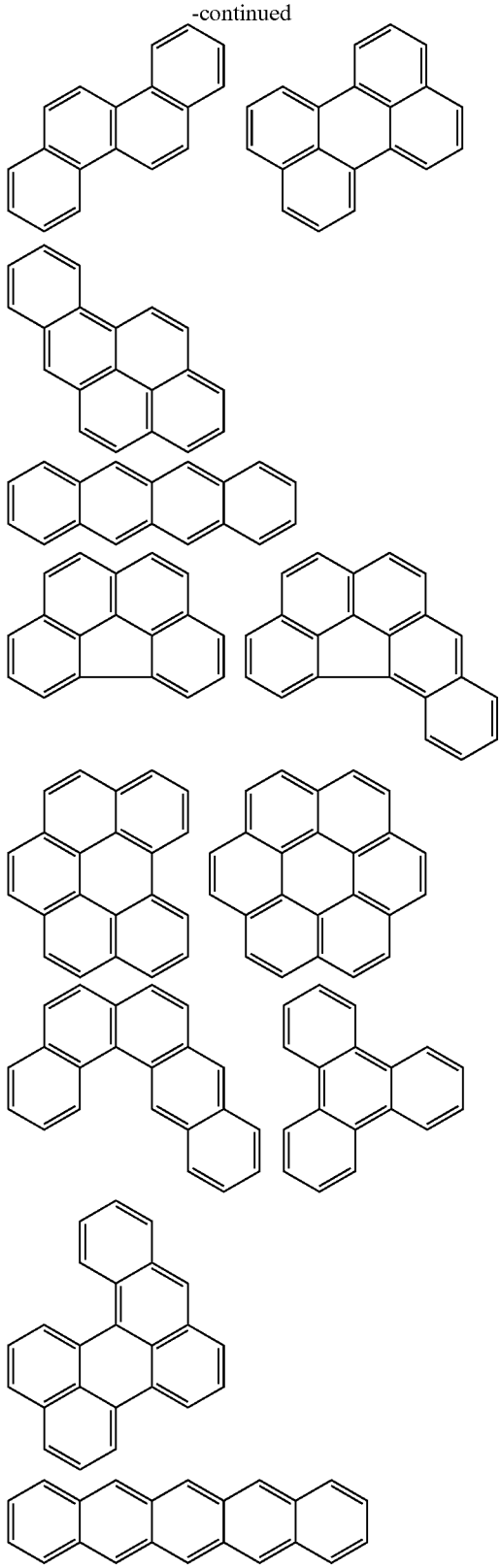

In an implementation, the second aromatic aldehyde compound may include a C6 to C30 aromatic ring substituted with a hydrophilic functional group, e.g., at least one hydroxy group. For example, when substituted with such a hydrophilic functional group, the polymer may not only increase solubility in a solvent but also form a rigid polymer layer, thereby providing high heat resistance and high etch resistance.

In an implementation, the second aromatic aldehyde compound may include, e.g., a C6 to C30 aromatic ring substituted with one hydroxy group. For example, when substituted with one hydroxy group, the solubility of the polymer for an organic solvent may be further increased than when substituted with a plurality of hydroxy groups.

In an implementation, the second aromatic aldehyde compound may include, e.g., a hydroxyphenyl group, a hydroxynaphthyl group, a hydroxybiphenyl group, a hydroxydiphenylfluorenyl group, a hydroxydinaphthylfluorenyl group, a hydroxyanthracenyl group, a hydroxyfluoranthenyl group, a hydroxyacenaphthylenyl group, a hydroxyacenaphthenyl group, a hydroxyphenanthrenyl group, a hydroxybenzophenanthrenyl group, a hydroxypyrenyl group, a hydroxytriperylenyl group, a hydroxychrysenyl group, a hydroxytetracenyl group, a hydroxybenzofluoranthenyl group, a hydroxyperylenyl group, a hydroxybenzopyrenyl group, a hydroxynaphthoanthracenyl group, a hydroxypentacenyl group, a hydroxybenzoperylenyl group, a hydroxydibenzopyrenyl group, a hydroxycoronenyl group, or a combination thereof.

In an implementation, the second aromatic aldehyde compound may not include a C6 to C30 aromatic ring substituted with a C3 to C20 branched alkyl group and may not include a C6 to C30 aromatic ring substituted with a tert-alkyl group. In an implementation, the second aromatic aldehyde compound may not include a C6 to C30 aromatic ring substituted with a tert-butyl group.

In an implementation, the second aromatic aldehyde compound may be represented by Chemical Formula 3.

[Chemical Formula 3]

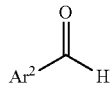

In Chemical Formula 3, $Ar^2$ may be or may include, e.g., a substituted or unsubstituted C6 to C30 aromatic ring.

In an implementation, $Ar^2$ may be, e.g., a substituted or unsubstituted ring moiety of Group 2.

[Group 2]

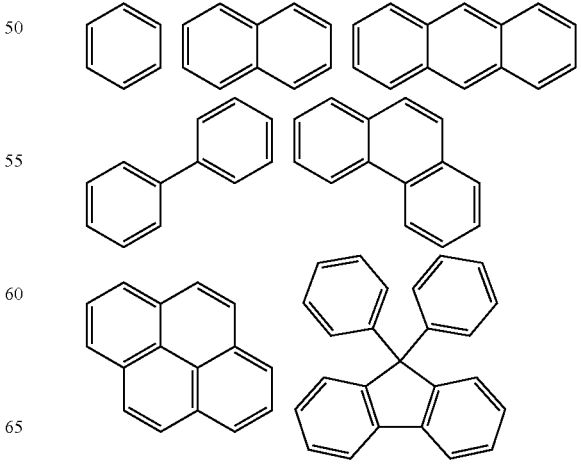

-continued

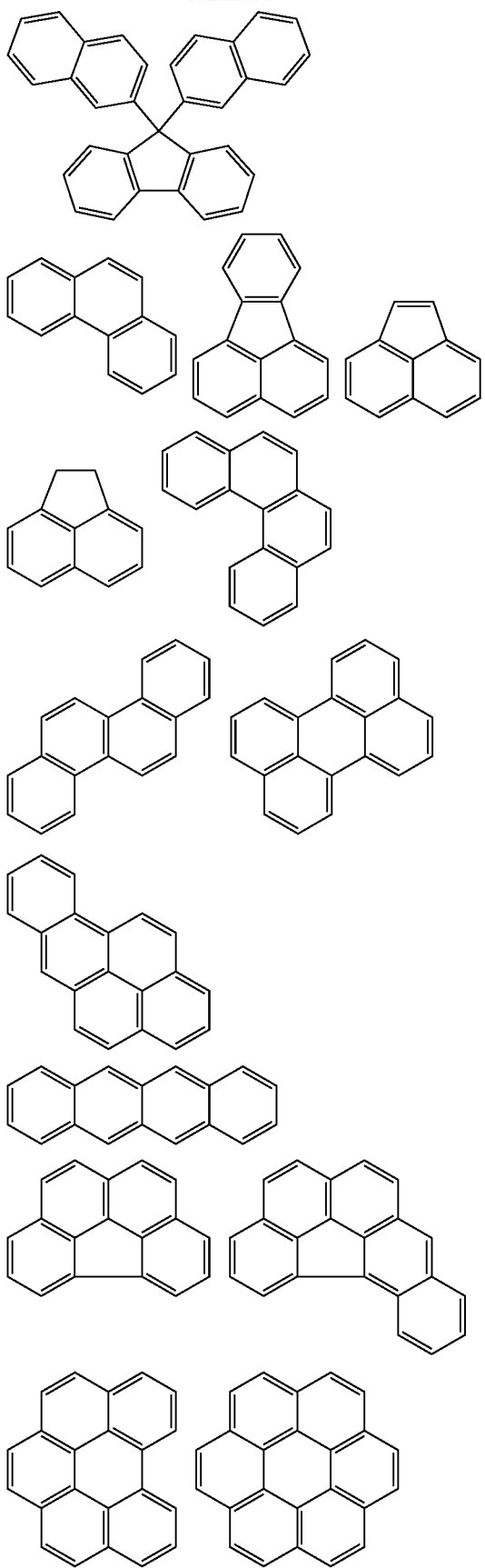

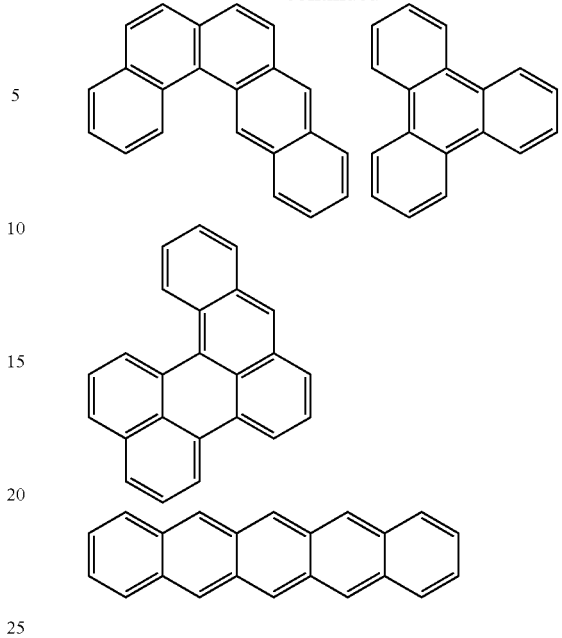

In an implementation, Ar² may be a non-condensed ring or a condensed ring. In an implementation, Ar² may be, e.g., a condensed ring.

In an implementation, Ar² may be a C6 to C30 aromatic ring substituted with at least one hydroxy group.

In an implementation, Ar² may be, e.g., a hydroxyphenyl group, a hydroxynaphthyl group, a hydroxybiphenyl group, a hydroxydiphenylfluorene group, a hydroxydinaphthylfluorenyl group, a hydroxyanthracenyl group, a hydroxyfluoranthenyl group, a hydroxyacenaphthylenyl group, a hydroxy acenaphthenyl group, hydroxyphenanthrenyl group, a hydroxybenzophenanthrenyl group, a hydroxypyrenyl group, a hydroxytriperylenyl group, a hydroxychrysenyl group, a hydroxytetracenyl group, a hydroxybenzofluoranthenyl group, a hydroxyperylenyl group, a hydroxybenzopyrenyl group, a hydroxynaphthoanthracenyl group, a hydroxypentacenyl group, a hydroxybenzoperylenyl group, a hydroxydibenzopyrenyl group, a hydroxycoronenyl group, dihydroxyphenyl group, dihydroxynaphthyl group, dihydroxybiphenyl group, dihydroxydiphenylfluorene group, dihydroxydinaphthylfluorenyl group, dihydroxyanthracenyl group, dihydroxyfluoranthenyl group, dihydroxyacenaphthylenyl group, dihydroxyacenaphthenyl group, dihydroxyphenanthrenyl group, dihydroxybenzophenanthrenyl group, dihydroxypyrenyl group, dihydroxytriperylenyl group, dihydroxychrysenyl group, dihydroxytetracenyl group, dihydroxybenzofluoranthenyl group, dihydroxyperylenyl group, dihydroxybenzopyrenyl group, dihydroxynaphthoanthracenyl group, dihydroxypentacenyl group, dihydroxybenzoperylenyl group, dihydroxydibenzopyrenyl group, dihydroxycoronenyl group, or a combination thereof.

In an implementation, Ar² may not be substituted with a C3 to C20 branched alkyl group. In an implementation, Ar² may not be substituted with a tert-alkyl group. In an implementation, Ar² may not be substituted with a tert-butyl group.

In an implementation, at least one of the first aromatic aldehyde compound and the second aromatic aldehyde compound may include a condensed ring.

In an implementation, the first aromatic aldehyde compound and the second aromatic aldehyde compound may both include condensed rings.

In an implementation, the first aromatic aldehyde compound may include, e.g., benzaldehyde substituted with a C3 to C20 branched alkyl group, naphthaldehyde substituted with a C3 to C20 branched alkyl group, anthracenecarboxaldehyde substituted with a C3 to C20 branched alkyl group, or pyrenecarboxaldehyde substituted with a C3 to C20 branched alkyl group, and the second aromatic aldehyde compound may include, e.g., a substituted or unsubstituted pyrenecarboxaldehyde.

In an implementation, the first aromatic aldehyde compound may include, e.g., tert-butyl benzaldehye, tert-butyl naphthaldehyde, tert-butyl anthracenecarboxaldehyde, or tert-butyl pyrenecarboxaldehyde, and the second aromatic aldehyde compound may include, e.g., a substituted or unsubstituted pyrenecarboxaldehyde.

In an implementation, the first aromatic aldehyde compound may include, e.g., ortho-tert-butyl benzaldehyde, meta-tert-butyl benzaldehyde, para-tert-butyl benzaldehye, 6-(tert-butyl)-2-naphthaldehyde, 10-tert-butyl-9-anthracenecarboxaldehyde, or 7-(tert-butyl)-1-pyrenecarboxaldehyde, and the second aromatic aldehyde compound may include, e.g., a substituted or unsubstituted pyrenecarboxaldehyde.

In an implementation, the substituted or unsubstituted pyrene carboxaldehyde may be hydroxy pyrenecarboxaldehyde, e.g., 6-hydroxy-1-pyrenecarboxaldehyde.

The polymer according to an embodiment may include one or more of the aforementioned structural units, and a plurality of the aforementioned structural units may have the same structure or may have different structures. The number and arrangement of the aforementioned structural units included in the polymer may be a suitable number and arrangement. In an implementation, the polymer may have a structure in which the same structural units are connected in series.

In an implementation, the indole compound may be included in an amount of, e.g., about 1 mol % to about 50 mol %, about 3 mol % to about 40 mol %, or about 5 mol % to about 30 mol %, based on a total mole number of the indole compound, the first aromatic aldehyde compound, and the second aromatic aldehyde compound in the reaction mixture.

In an implementation, the first aromatic aldehyde compound may be included in an amount of, e.g., about 1 mol % to about 80 mol %, about 5 mol % to about 60 mol %, or about 10 mol % to about 50 mol %, based on the total mole number of the indole compound, the first aromatic aldehyde compound, and the second aromatic aldehyde compound in the reaction mixture.

In an implementation, the second aromatic aldehyde compound may be included in an amount of, e.g., about 1 mol % to about 80 mol %, about 5 mol % to about 60 mol %, or about 10 mol % to about 50 mol %, based on the total mole number of the indole compound, the first aromatic aldehyde compound, and the second aromatic aldehyde compound in the reaction mixture.

In an implementation, the polymer may further include one or more structural units different from the structural units described above, in addition thereto.

In an implementation, the polymer according to an embodiment may include a combination of a moiety derived from the indole compound, a moiety derived from the first aromatic aldehyde compound, and a moiety derived from the second aromatic aldehyde compound.

By including all of the combinations, the polymer may not only increase a solubility for a solvent, but also may form a rigid polymer layer, thereby providing high heat resistance and high etch resistance.

In an implementation, the polymer may have a weight average molecular weight of, e.g., about 500 to about 100,000. In an implementation, the polymer may have a weight average molecular weight of, e.g., about 1,000 to about 50,000, or about 1,200 to about 10,000. By having the average molecular weight within the range, a carbon content and a solubility of the solvent of the polymer may be adjusted to be optimized.

According to another embodiment, a hardmask composition including the aforementioned polymer and a solvent may be provided.

In an implementation, the solvent included in the hardmask composition may be a suitable solvent, e.g., a solvent sufficient to dissolve or disperse the polymer. In an implementation, the solvent may include, e.g., propylene glycol, propylene glycol diacetate, methoxy propanediol, diethylene glycol, diethylene glycol butylether, tri(ethylene glycol) monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone, or ethyl 3-ethoxypropionate.

In an implementation, the polymer may be included in the composition in an amount of about 0.1 wt % to about 50 wt %, e.g., about 0.5 wt % to about 40 wt %, about 1 wt % to about 30 wt %, or about 3 wt % to about 20 wt %, based on a total weight of the hardmask composition. When the polymer is included within the range, a thickness, surface roughness and planarization of the hardmask may be controlled.

In an implementation, the hardmask composition may further include an additive, e.g., a surfactant, a cross-linking agent, a thermal acid generator, a plasticizer, or the like.

In an implementation, the surfactant may include, e.g., a fluoroalkyl-based compound, an alkylbenzene sulfonate salt, an alkyl pyridinium salt, polyethylene glycol, or a quaternary ammonium salt.

In an implementation, the cross-linking agent may be, e.g., a melamine-based, substituted urea-based, or a polymer-based cross-linking agent. In an implementation, it may be a cross-linking agent having at least two cross-linking forming substituents, e.g., a compound such as methoxymethylated glycoluril, butoxymethylated glycoluril, methoxymethylated melamine, butoxymethylated melamine, methoxymethylated benzoguanamine, butoxymethylated benzoguanamine, methoxymethylatedurea, butoxymethylatedurea, methoxymethylated thiourea, or butoxymethylated thiourea, or the like.

The cross-linking agent may be a cross-linking agent having high heat resistance. The cross-linking agent having high heat resistance may be a compound including a cross-linking substituent including an aromatic ring (e.g., a benzene ring or a naphthalene ring) in the molecule.

In an implementation, the thermal acid generator may be e.g., an acidic compound such as p-toluene sulfonic acid, trifluoromethanesulfonic acid, pyridiniump-toluenesulfonic acid, salicylic acid, sulfosalicylic acid, citric acid, benzoic acid, hydroxybenzoic acid, naphthalenecarbonic acid, and the like or/and 2,4,4,6-tetrabromocyclohexadienone, benzointosylate, 2-nitrobenzyltosylate, other organosulfonic acid alkylester, or the like.

In an implementation, the additive may be included in an amount of, e.g., about 0.001 parts by weight to about 40 parts by weight, about 0.01 parts by weight to about 30 parts by weight, or about 0.1 parts by weight to about 20 parts by weight, based on 100 parts by weight of the hardmask composition. Within the ranges, solubility may be improved while optical properties of the hardmask composition are not changed.

According to another embodiment, an organic layer manufactured using the aforementioned hardmask composition may be provided. The organic layer may be, e.g., formed by coating the aforementioned hardmask composition on a substrate and heat-treating it for curing and may include, e.g., a hardmask layer, a planarization layer, a sacrificial layer, a filler, and the like for an electronic device.

Hereinafter, a method of forming a pattern using the aforementioned hardmask composition described above is described.

A method of forming patterns according to an embodiment may include, e.g., forming a material layer on a substrate, applying the hardmask composition including the polymer and a solvent on the material layer, heat-treating the hardmask composition to form a hardmask layer, forming a photoresist layer on the hardmask layer, exposing and developing the photoresist layer to form a photoresist pattern, selectively removing the hardmask layer using the photoresist pattern to expose a portion of the material layer, and etching an exposed portion of the material layer.

The substrate may be, e.g., a silicon wafer, a glass substrate, or a polymer substrate.

The material layer may be a material to be finally patterned, e.g., a metal layer such as an aluminum layer or a copper layer, a semiconductor layer such as a silicon layer, or an insulation layer such as a silicon oxide layer or a silicon nitride layer. The material layer may be formed through a method such as a chemical vapor deposition (CVD) process.

The hardmask composition according to an embodiment may be applied by spin-on coating in a form of a solution. In an implementation, an application thickness of the hardmask composition may be, e.g., about 50 Å to about 200,000 Å.

The heat-treating of the hardmask composition may be performed, e.g., at about 100° C. to about 700° C. for about 10 seconds to about 1 hour.

In an implementation, the method may further include forming a silicon-containing thin layer on the hardmask layer. The silicon-containing thin layer may be formed of a material, e.g., SiCN, SiOC, SiON, SiOCN, SiC, SiO, SiN, or the like.

In an implementation, the method may further include forming a bottom antireflective coating (BARC) on the upper surface of the silicon-containing thin layer or on the upper surface hardmask layer before forming the photoresist layer.

Exposure of the photoresist layer may be performed using, e.g., ArF, KrF, or EUV. After exposure, heat-treating may be performed at, e.g., about 100° C. to about 700° C.

The etching process of the exposed portion of the material layer may be performed through a dry etching process using an etching gas and the etching gas may be, e.g., $CHF_3$, $CF_4$, $Cl_2$, $BCl_3$, or a mixed gas thereof.

The etched material layer may be formed in a plurality of patterns, and the plurality of patterns may be a metal pattern, a semiconductor pattern, an insulation pattern, or the like, e.g., diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Polymers

Synthesis Example 1: Synthesis of Polymer 1

Indole (14.1 g, 0.12 mol), 6-hydroxy-1-pyrenecarboxaldehyde (29.5 g, 0.12 mol), diethyl sulfate (15.4 g, 0.10 mol), and 120 g of 1,4-dioxane were put in a 500 mL 2-neck round-bottomed flask equipped with a condenser and then, stirred for a reaction at 100° C. for 10 hours to 24 hours, and 4-tert-butyl benzaldehyde (38.9 g, 0.24 mol) was added thereto and then, stirred for a reaction at 100° C. for 10 hours to 48 hours. After the reaction, the resultant was cooled down to ambient temperature, diluted with 400 g of ethyl acetate, and washed ten times with 400 g of distilled water. An organic layer therefrom was concentrated under a reduced pressure, diluted with 200 g of THF, and then, added in a dropwise fashion to 1 kg of hexane to obtain precipitates. The precipitates were filtered and dried to obtain Polymer 1. (Mw: 1,500)

Synthesis Example 2: Synthesis of Polymer 2

Polymer 2 was manufactured according to the same method as Synthesis Example 1 except that 6-tert-butyl-2-naphthaldehyde (50.9 g, 0.24 mol) was used instead of the 4-tert-butyl benzaldehyde (38.9 g, 0.24 mol). (Mw: 1,460)

Synthesis Example 3: Synthesis of Polymer 3

Polymer 3 was manufactured according to the same method as Synthesis Example 1 except that 10-tert-butyl-9-anthracenecarboxaldehyde (63.0 g, 0.24 mol) was used instead of the 4-tert-butyl benzaldehyde (38.9 g, 0.24 mol). (Mw: 1,640)

Synthesis Example 4: Synthesis of Polymer 4

Polymer 4 was manufactured according to the same method as Synthesis Example 1 except that 7-tert-butyl-1-pyrenecarboxaldehyde (68.7 g, 0.24 mol) was used instead of the 4-tert-butyl benzaldehyde (38.9 g, 0.24 mol).
(Mw: 1,520)

Comparative Synthesis Example 1: Synthesis of Polymer A

Indole (14.1 g, 0.12 mol), 6-hydroxy-1-pyrenecarboxaldehyde (29.5 g, 0.12 mol), diethylsulfate (15.4 g, 0.10 mol), and propylene glycolmethyletheracetate (PGMEA, 115 g) were put in a 500 mL 2-neck round-bottomed flask equipped with a condenser and then, stirred for a reaction at 100° C. for 10 hours to 24 hours. After the reaction, the resultant was cooled down to ambient temperature, diluted with 400 g of ethyl acetate, and then, washed ten times with 400 g of distilled water. An organic layer therefrom was concentrated under a reduced pressure, diluted with 200 g of THF, and dropped in a dropwise fashion to 1 kg of hexane to obtain precipitates. The precipitates were filtered and dried to obtain Polymer A. (Mw: 1,700)

Comparative Synthesis Example 2: Synthesis of Polymer B 6-hydroxy-1-pyrenecarboxaldehyde (29.5 g, 0.12 mol), 1-naphthol (17.3 g, 0.12 mol), diethylsulfate (15.4 g, 0.10 mol), and 115 g of PGMEA were put in a 500 mL 2-neck round-bottomed flask equipped with a condenser and then, stirred for a reaction at 100° C. for 10 hours to 24 hours. After the reaction, the mixed solution was cooled down to ambient temperature, diluted with 400 g of ethyl acetate, and washed ten times with 400 g of distilled water. An organic layer therefrom was concentrated under a reduced pressure, diluted with 200 g of THF, and then, added in a dropwise fashion to 1 kg of hexane to obtain precipitates. The precipitates were filtered and dried to obtain Polymer B. (Mw: 1,500)

Comparative Synthesis Example 3: Synthesis of Polymer C 6-hydroxy-1-pyrenecarboxaldehyde (29.5 g, 0.12 mol), 1-naphthol (17.3 g, 0.12 mol), diethylsulfate (15.4 g, 0.10 mol), and 115 g of PGMEA were put in a 500 mL 2-neck round-bottomed flask equipped with a condenser and then, stirred for a reaction at 100° C. for 10 hours to 24 hours. Additionally, 6-tert-butyl-2-naphthaldehyde (50.9 g, 0.24 mol) was added thereto and then, stirred for a reaction at 100° C. for 10 hours to 48 hours. After the reaction, the mixed solution was cooled down to ambient temperature, diluted with 400 g of ethyl acetate, and washed ten times with 400 g of distilled water. An organic layer therefrom was concentrated under a reduced pressure, diluted with 200 g of THF, and added in a dropwise fashion to 1 kg of hexane to obtain precipitates. The precipitates were filtered and dried to obtain Polymer C. (Mw: 1,480)

Evaluation 1: Solubility Evaluation 5.0 g samples of each polymers according to Synthesis Examples 1 to 4 and Comparative Synthesis Examples 1 to 3 were respectively uniformly dissolved in 45 g of PGMEA to prepare a 10% solution, and then, filtered with a 0.1 μm TEFLON (tetrafluoroethylene) filter. The filtered samples were respectively subdivided and weighed by using an Al dish whose mass was known to measure initial mass of the solutions. Subsequently, the solvents were respectively dried therefrom in a 160° C. oven for 20 minutes, and the mass was measured again.

From a mass difference before and after the drying, each solid content of the solutions was calculated according to Calculation Equation 1.

Solid content (%)=(mass after drying at 160° C. for 20 minutes/initial mass of solution)×100   [Calculation Equation 1]

TABLE 1

|  | Solid content | Solubility |
| --- | --- | --- |
| Synthesis Example 1 | 9.9% | ○ |
| Synthesis Example 2 | 9.7% | ○ |
| Synthesis Example 3 | 9.7% | ○ |
| Synthesis Example 4 | 9.5% | ○ |
| Comparative Synthesis Example 1 | 7.2% | X |
| Comparative Synthesis Example 2 | 8.4% | X |
| Comparative Synthesis Example 3 | 6.9% | X |

○: a solid content of greater than or equal to 9.5% and less than or equal to 10%
X: a solid content of less than 9.5%

Referring to Table 1, the polymers according to Synthesis Examples 1 to 4 exhibited improved solubility, compared with the polymers according to Comparative Synthesis Examples 1 to 3.

Formation of Hardmask Composition 2.0 g samples of the polymers according to Synthesis Examples 1 to 4 and Comparative Synthesis Examples 1 to 3 were respectively uniformly dissolved in 18 g of cyclohexanone, and filtered with a 0.1 μm TEFLON (tetrafluoroethylene) filter to prepare hardmask compositions according to Examples 1 to 4 and Comparative Examples 1 to 3.

Evaluation 2: Evaluation of Etch Resistance

The hardmask compositions according to the Example 1 to 4 and Comparative Example 1 to 3 were respectively spin-coated on silicon wafers, and then heat treated at about 400° C. for 2 minutes to form organic layers.

The thicknesses of the organic layers were measured by ST5000 thin film thickness measuring instrument made by K-MAC, followed by dry etching for 100 seconds and 60 seconds using $CF_x$ gas and $N_2/O_2$ gas in the organic layers, respectively, and then the thicknesses of the organic layers were measured again.

The bulk etch rates (BER) were calculated by Equation 2 from the thickness differences before and after dry etching and the etching times of the organic layers.

Etch rate (Å/s)=(Initial thickness of organic layer−thickness of organic layer after etching)/etching time   [Calculation Equation 2]

The results are shown in Table 2.

TABLE 2

|  | Bulk etch rate (Å/sec) | |
| --- | --- | --- |
|  | $CF_x$ etch rate (Å/s) | $N_2/O_2$ etch rate (Å/s) |
| Example 1 | 27.2 | 24.1 |
| Example 2 | 26.4 | 23.8 |
| Example 3 | 25.0 | 23.2 |
| Example 4 | 24.6 | 22.7 |
| Comparative Example 1 | 29.1 | 26.3 |
| Comparative Example 2 | 31.5 | 27.0 |
| Comparative Example 3 | 28.1 | 25.8 |

Referring to Table 2, the organic layers prepared using the hardmask compositions according to Examples 1 to 4 exhibited sufficient etch resistances against the etching gas, thereby improving the etch resistances, compared with the organic layers prepared using the hardmask compositions according to Comparative Examples 1 to 3.

Evaluation 3: Evaluation of Heat Resistance

The hardmask compositions according to Examples 1 to 4 and Comparative Examples 1 to 3 were respectively spin-coated on silicon wafers, and then heat treated at about 400° C. for 2 minutes to form organic layers. The organic layers were prepared into pellets and the initial masses were measured. Subsequently, the organic pellets were heat-treated at 400° C. for 30 minutes under a nitrogen condition, and then the masses of the organic pellets were measured again.

From the mass differences before and after 400° C. heat treatment of the organic layers, mass loss rates were calculated by Calculation Equation 3. (Thermogravimetric analysis (TGA))

The results are shown in Table 3.

Mass loss rate (%)={(initial mass−mass after a temperature is increased up to 400° C.)/initial mass}×100   [Calculation Equation 3]

TABLE 3

| | Mass loss rate at 400° C. (%) |
|---|---|
| Example 1 | 15.3 |
| Example 2 | 11.6 |
| Example 3 | 8.3 |
| Example 4 | 6.2 |
| Comparative Example 1 | 21.7 |
| Comparative Example 2 | 33.9 |
| Comparative Example 3 | 20.5 |

Referring to Table 3, the organic layers prepared using the hardmask compositions according to Examples 1 to 4 exhibited lower mass loss rates after the temperature raising process to 400° C., and more improved heat resistances, than the organic layers prepared using the hardmask compositions according to Comparative Examples 1 to 3.

By way of summation and review, according to small-sizing the pattern to be formed, it could be difficult to provide a fine pattern having an excellent profile by using some lithographic techniques. For example, an auxiliary layer, called a hardmask layer, may be formed between the material layer and the photoresist layer to provide a fine pattern.

One or more embodiments may provide a polymer that may be effectively applicable to a hardmask layer.

A solubility of the polymer and etch resistance and heat resistance of hardmask layer may be simultaneously secured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A polymer comprising structural units obtained by a reaction of a reaction mixture that includes:
    a substituted or unsubstituted indole compound,
    a first aromatic aldehyde compound including a substituted or unsubstituted C3 to C20 branched alkyl group thereon, and
    a second aromatic aldehyde compound that is different from the first aromatic aldehyde compound.

2. The polymer as claimed in claim 1, wherein the indole compound is represented by Chemical Formula 1:

[Chemical Formula 1]

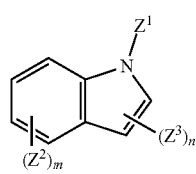

wherein, in Chemical Formula 1,
$Z^1$ is hydrogen, a hydroxy group, a halogen atom, a substituted or unsubstituted C1 to C30 alkoxy group, a substituted or unsubstituted C1 to C30 alkyl group, a substituted or unsubstituted C1 to C30 cycloalkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heterocyclic group, or a combination thereof, $Z^2$ and $Z^3$ are independently a hydroxy group, a halogen atom, a substituted or unsubstituted C1 to C30 alkoxy group, a substituted or unsubstituted C1 to C30 alkyl group, a substituted or unsubstituted C1 to C30 cycloalkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heterocyclic group, or a combination thereof, m is an integer of 0 to 4, and n is an integer of 0 to 2.

3. The polymer as claimed in claim 1, wherein the substituted or unsubstituted C3 to C20 branched alkyl group is a substituted or unsubstituted tert-butyl group.

4. The polymer as claimed in claim 1, wherein the first aromatic aldehyde compound includes a substituted or unsubstituted aromatic ring moiety of Group 1:

[Group 1]

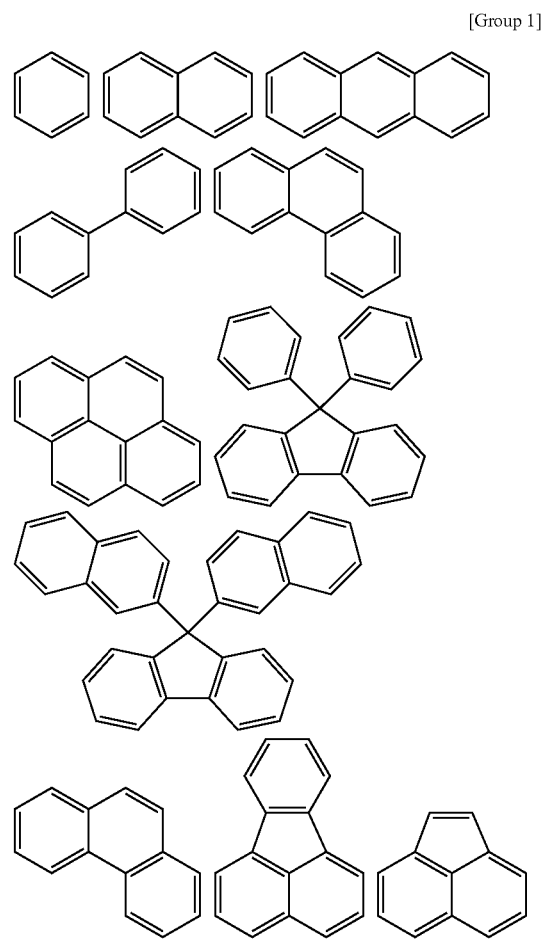

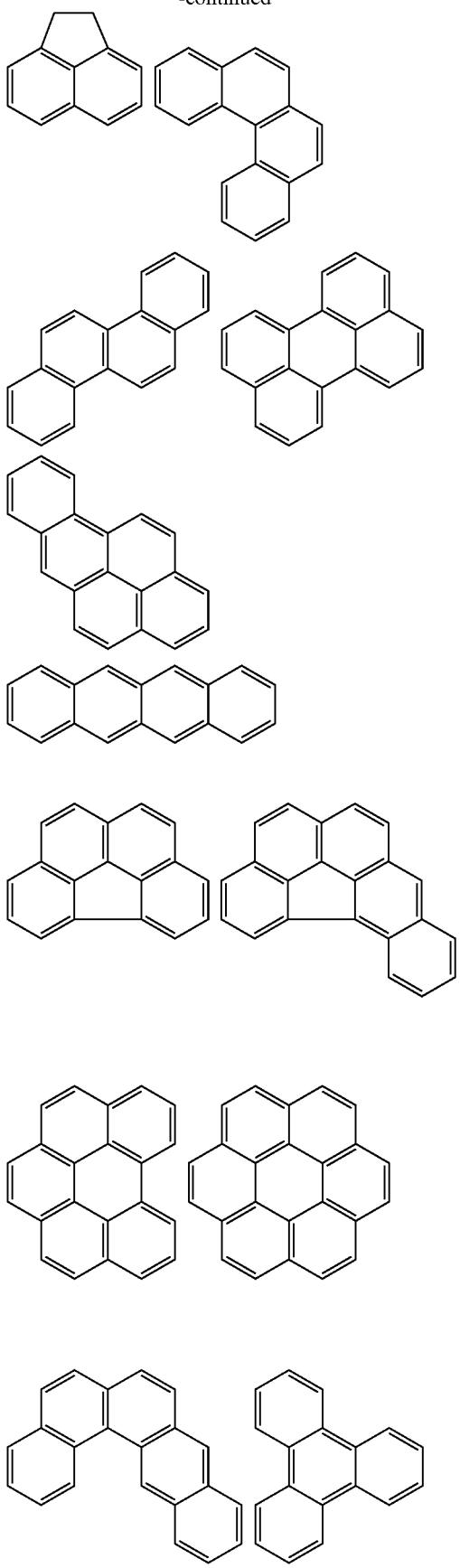

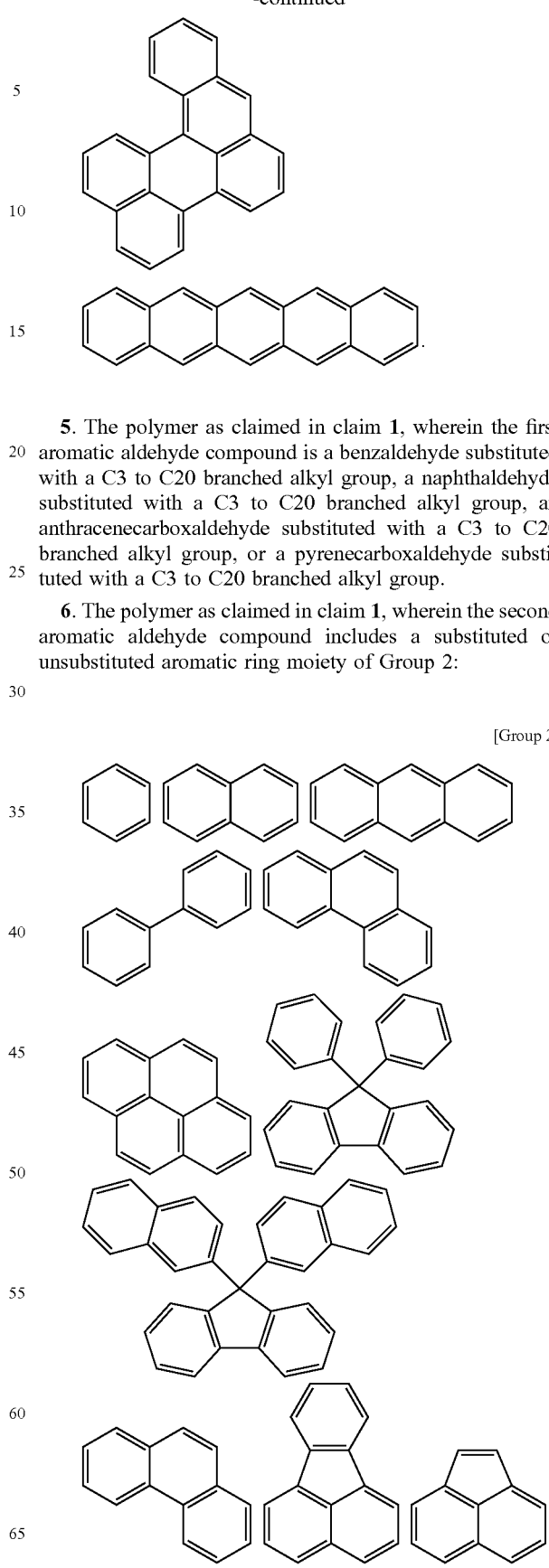

5. The polymer as claimed in claim 1, wherein the first aromatic aldehyde compound is a benzaldehyde substituted with a C3 to C20 branched alkyl group, a naphthaldehyde substituted with a C3 to C20 branched alkyl group, an anthracenecarboxaldehyde substituted with a C3 to C20 branched alkyl group, or a pyrenecarboxaldehyde substituted with a C3 to C20 branched alkyl group.

6. The polymer as claimed in claim 1, wherein the second aromatic aldehyde compound includes a substituted or unsubstituted aromatic ring moiety of Group 2:

[Group 2]

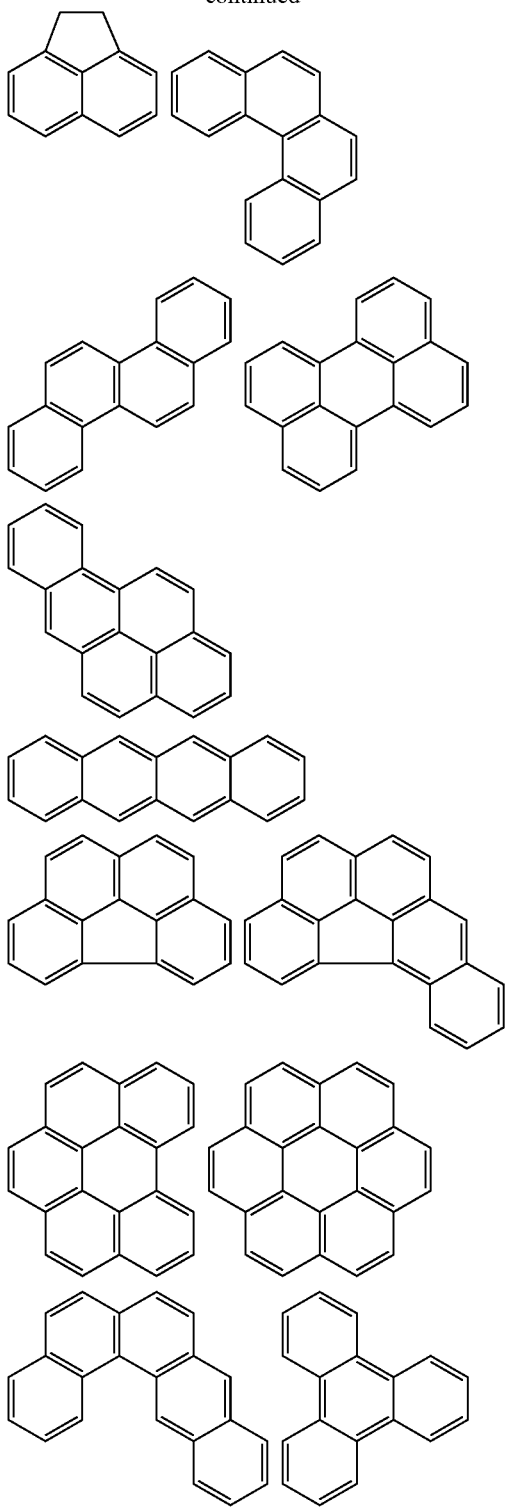
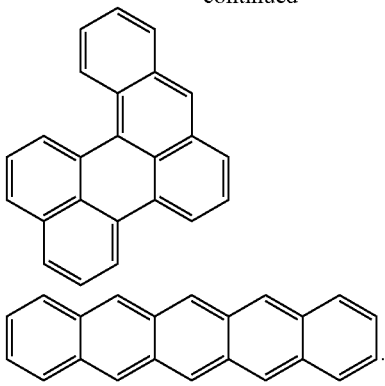

7. The polymer as claimed in claim 1, wherein the second aromatic aldehyde compound includes a C6 to C30 aromatic ring substituted at least one hydroxy group.

8. The polymer as claimed in claim 1, wherein at least one of the first aromatic aldehyde compound and the second aromatic aldehyde compound includes a condensed ring.

9. The polymer as claimed in claim 1, wherein:
the first aromatic aldehyde compound is a benzaldehyde substituted with a C3 to C20 branched alkyl group, a naphthaldehyde substituted with a C3 to C20 branched alkyl group, an anthracenecarboxaldehyde substituted with a C3 to C20 branched alkyl group, or a pyrenecarboxaldehyde substituted with a C3 to C20 branched alkyl group, and
the second aromatic aldehyde compound is a substituted or unsubstituted pyrenecarboxaldehyde.

10. The polymer as claimed in claim 1, wherein:
the indole compound is included in the reaction mixture in an amount of about 1 mol % to about 50 mol %,
the first aromatic aldehyde compound is included in the reaction mixture in an amount of about 1 mol % to about 80 mol %, and
the second aromatic aldehyde compound is included in the reaction mixture in an amount of about 1 mol % to about 80 mol %, all mol % being based on a total number of moles of the indole compound, the first aromatic aldehyde compound, and the second aromatic aldehyde compound in the reaction mixture.

11. A hardmask composition, comprising:
the polymer as claimed in claim 1, and
a solvent.

12. A method of forming patterns, the method comprising:
applying the hardmask composition as claimed in claim 11 on a material layer and heat-treating the same to form a hardmask layer,
forming a photoresist layer on the hardmask layer,
exposing and developing the photoresist layer to form a photoresist pattern,
selectively removing the hardmask layer using the photoresist pattern to expose a portion of the material layer, and
etching the exposed portion of the material layer.

* * * * *